United States Patent
Bae et al.

(10) Patent No.: US 10,274,666 B2
(45) Date of Patent: Apr. 30, 2019

(54) BACKLIGHT UNIT, FABRICATION METHOD THEREOF, AND DISPLAY DEVICE INCLUDING THE SAME

(71) Applicant: Samsung Display Co., Ltd., Yongin-Si, Gyeonggi-Do (KR)

(72) Inventors: Kwangsoo Bae, Suwon-si (KR); Jungsuk Bang, Seoul (KR); Minjeong Oh, Gimpo-si (KR); Haeju Yun, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/811,741

(22) Filed: Nov. 14, 2017

(65) Prior Publication Data
US 2018/0136384 A1    May 17, 2018

(30) Foreign Application Priority Data
Nov. 17, 2016    (KR) .................... 10-2016-0153496

(51) Int. Cl.
| | |
|---|---|
| G02B 6/00 | (2006.01) |
| F21V 8/00 | (2006.01) |
| H01L 27/12 | (2006.01) |
| G02F 1/133 | (2006.01) |
| G02F 1/1335 | (2006.01) |

(Continued)

(52) U.S. Cl.
CPC ............ *G02B 6/005* (2013.01); *G02B 6/009* (2013.01); *G02B 6/0055* (2013.01); *G02B 6/0065* (2013.01); *G02B 6/0088* (2013.01); *G02B 6/0091* (2013.01); *H01L 27/1255* (2013.01); *G02F 1/1368* (2013.01); *G02F 1/13306* (2013.01); *G02F 1/133514* (2013.01); *G02F 1/134309* (2013.01); *G02F 1/136213* (2013.01);

(Continued)

(58) Field of Classification Search
CPC ..... G02B 6/005; G02B 6/0055; G02B 6/0065
See application file for complete search history.

(56) References Cited

U.S. PATENT DOCUMENTS

| | | | |
|---|---|---|---|
| 7,808,582 B2 | 10/2010 | Hwang et al. | |
| 8,226,256 B2 | 7/2012 | Urabe et al. | |

(Continued)

FOREIGN PATENT DOCUMENTS

| | | |
|---|---|---|
| JP | 2007248484 A | 9/2007 |
| KR | 100861982 B1 | 10/2008 |

(Continued)

*Primary Examiner* — Anne M Hines
(74) *Attorney, Agent, or Firm* — Cantor Colburn LLP

(57) ABSTRACT

A backlight unit includes a light source; a light guide plate; and an optical member on the light guide plate. The optical member includes first insulating patterns into which light from the light guide plate is incident to the optical member; a first insulating layer which covers the first insulating patterns; second insulating patterns into which light from the first insulating layer is incident; and a second insulating layer which covers the second insulating patterns. The light guide plate includes a light incident side surface, pairs of insulating patterns each include one first insulating pattern and one second insulating pattern, and in a top plan view, for each pair of insulating patterns, the first insulating pattern is closer to the light incident side surface than the second insulating pattern.

20 Claims, 12 Drawing Sheets

(51) Int. Cl.
  *G02F 1/1343* (2006.01)
  *G02F 1/1362* (2006.01)
  *G02F 1/1368* (2006.01)

(52) U.S. Cl.
  CPC .............. *G02F 1/136286* (2013.01); *G02F 2001/134318* (2013.01); *G02F 2201/123* (2013.01)

(56) References Cited

U.S. PATENT DOCUMENTS

| | | |
|---|---|---|
| 8,284,346 B2 | 10/2012 | Park et al. |
| 9,146,342 B2 * | 9/2015 | Wolk .................... G02B 6/005 |
| 9,618,681 B2 | 4/2017 | Cheng et al. |
| 2014/0029270 A1 * | 1/2014 | Suzuki ............... B23K 26/0066 |
| | | 362/317 |
| 2014/0092629 A1 * | 4/2014 | Lin ..................... G02B 6/0036 |
| | | 362/607 |
| 2014/0132883 A1 * | 5/2014 | Roberts ................ G02F 1/1334 |
| | | 349/62 |

FOREIGN PATENT DOCUMENTS

| | | |
|---|---|---|
| KR | 101155876 B1 | 6/2012 |
| KR | 101286095 B1 | 7/2013 |
| KR | 101720959 A | 3/2017 |

\* cited by examiner

BACKLIGHT UNIT, FABRICATION METHOD THEREOF, AND DISPLAY DEVICE INCLUDING THE SAME

This application claims priority to Korean Patent Application No. 10-2016-0153496, filed on Nov. 17, 2016, and all the benefits accruing therefrom under 35 U.S.C. § 119, the content of which in its entirety is herein incorporated by reference.

BACKGROUND (1) Field

The present disclosure relates to a backlight unit, a fabrication method thereof, and a display device including the same.

(2) Description of the Related Art

In general, a display device includes a display panel, which is configured to display an image using light, and a backlight unit, which is configured to generate the light and provide the light to the display panel. The display panel includes a first substrate with a plurality of pixels, a second substrate provided to face the first substrate, and an image display layer between the first and second substrates. An edge-type backlight unit, which is provided to face a side surface of the display device, is one type of backlight units.

Transmittance of the light provided from the backlight unit to the display panel is controlled by the image display layer, which is driven by the pixels, and the transmittance of the light is exploited to display an image. A liquid crystal layer, an electrowetting layer, or an electrophoresis layer may be used as the image display layer.

The edge-type backlight unit includes a light source for generating light, a light guide plate, which is used to guide the light provided from the light source toward the display panel and/or in an upward direction, and an optical sheet, which is provided between the light guide plate and the display panel and is used to condense the light transmitting from the light guide plate to the display panel or in the upward direction.

SUMMARY

One or more embodiment of the invention provides a thin backlight unit, which is configured to emit light with improved efficiency, a method of fabricating the backlight unit, and a display device including the backlight unit.

According to an exemplary embodiment, a backlight unit includes a light source which generates light; a light guide plate which guides the light from the light source and emits guided light through an upper surface of the light guide plate which faces a display panel which displays an image with the emitted light; and an optical member disposed on the upper surface of the light guide plate to be between the light guide plate and the display panel and to refract the guided light from the upper surface of the light guide plate toward the display panel. The optical member includes: a plurality of first insulating patterns into which the guided light from the upper surface of the light guide plate is incident and which is disposed on the light guide plate; a first insulating layer which covers the first insulating patterns; a plurality of second insulating patterns into which the guided light from the first insulating layer is incident and which is disposed on the first insulating layer; and a second insulating layer which covers the second insulating patterns. The light guide plate includes a light incident side surface at which the light source is disposed and through which the light from the light source is incident to the light guide plate, pairs of insulating patterns within the optical member each include one first insulating pattern and one second insulating pattern, and in a top plan view, for each pair of insulating patterns within the optical member, the first insulating pattern is closer to the light incident side surface of the light guide plate than the second insulating pattern.

In some embodiments, each of the first and second insulating patterns may include an inorganic material, and each of the first and second insulating layers may include an organic material.

In some embodiments, each of the first and second insulating patterns may have a refractive index higher than that of the light guide plate, each of the first and second insulating layers may have a refractive index lower than or equal to that of the light guide plate, the refractive indices of the first and second insulating patterns may be the same as each other, and the refractive indices of the first and second insulating layers may be the same as each other.

In some embodiments, the first insulating layer may include a first sub-insulating layer defining a plurality of first openings, in which the first insulating patterns are respectively disposed, and a second sub-insulating layer which disposes each of the first sub-insulating layer and the first insulating patterns between the light guide plate and the second sub-insulating layer.

In some embodiments, the second insulating layer may include a third sub-insulating layer defining a plurality of second openings in which the second insulating patterns are respectively disposed, and a fourth sub-insulating layer which disposes each of the third sub-insulating layer and the second insulating patterns between the first insulating layer and the fourth sub-insulating layer, and in a direction normal to the upper surface of the light guide plate, respective thicknesses of each of the first and second insulating patterns may be the same as each other, and respective thicknesses of each of the first, second, third, and fourth sub-insulating layers may be the same as each other.

In some embodiments, each of the first and second insulating patterns may include a lower surface and an upper surface which is further from the upper surface of the light guide plate than the lower surface, each of the lower and upper surfaces having a circular shape; and a side surface which connects the lower surface and the upper surface to each other, in a direction parallel to the upper surface of the light guide plate, a width of the lower surface may be smaller than that of the upper surface, and in cross-section, and the side surface may be inclined at an angle relative to the upper surface of the light guide plate.

In some embodiments, the angle of the side surface relative to the upper surface of the light guide plate may range from about 60° to about 75°.

In some embodiments, within each of the first and second insulating patterns, a ratio of a thickness thereof in a direction normal to the upper surface of the light guide plate and the width of the lower surface may be about 1:2.

In some embodiments, in a direction normal to the upper surface of the light guide plate: a thickness of each of the first and second insulating patterns may be about 1 micrometer ($\mu m$), a thickness of each of the first and second insulating layers may be about 2 $\mu m$, and the width of the lower surface of each of the first and second insulating patterns may be about 2 $\mu m$.

In some embodiments, in the top plan view, for each pair of insulating patterns within the optical member, the second insulating pattern may overlap the first insulating patterns.

In some embodiments, the angle of the side surface relative to the upper surface of the light guide plate may range from about 65° to about 75°.

In some embodiments, in the top plan view, for each pair of insulating patterns within the optical member, the second insulating pattern may not overlap the first insulating patterns.

In some embodiments, the angle of the side surface relative to the upper surface of the light guide plate may range from about 60° to about 65°.

In some embodiments, the first insulating patterns and the second insulating patterns may be each respectively arranged to form a plurality of rows and a plurality of columns within the optical member, and within each pair of the insulating patterns, the first and second insulating patterns may be arranged in the same row.

According to an exemplary embodiment of the invention, a method of fabricating a backlight unit includes: forming an optical member on a light emitting surface of a light guide plate to dispose the optical member between the light guide plate and a display panel which displays an image with the emitted light, the forming the optical member including: forming a first sub-insulating layer including a plurality of first openings defined therein, on the light emitting surface of the light guide plate, forming a plurality of first insulating patterns in the first openings, respectively, forming a second sub-insulating layer on the first sub-insulating layer and on the first insulating patterns to dispose each of the first sub-insulating layer and the first insulating patterns between the light guide plate and the second sub-insulating layer, forming a third sub-insulating layer including a plurality of second openings defined therein, on the second sub-insulating layer, to dispose the second sub-insulating layer between the third sub-insulating layer and each of the first sub-insulating layer and the first insulating patterns, forming a plurality of second insulating patterns in the second openings, respectively, and forming a fourth sub-insulating layer on the third sub-insulating layer and on the second insulating patterns to dispose each of the third sub-insulating layer and the second insulating patterns between the second sub-insulating layer and the fourth sub-insulating layer, and disposing a light source to face an incident side surface of the light guide plate. Pairs of insulating patterns within the optical member each include one first insulating pattern and one second insulating pattern, and in a top plan view, for each pair of insulating patterns within the optical member, the first insulating pattern is closer to the light incident side surface of the light guide plate than the second insulating pattern.

According to one or more embodiment of the invention, a display device includes include a display panel which displays an image using light; and a backlight unit which generates and provides the light to the display panel. The backlight unit includes: a light source which generates the light; a light guide plate which guides the light from the light source and emits guided light through an upper surface of the light guide plate which faces the display panel; and an optical member disposed on the upper surface of the light guide plate to be between the light guide plate and the display panel and to refract the guided light from the upper surface of the light guide plate toward the display panel. The member includes: a plurality of first insulating patterns into which the guided light from the upper surface of the light guide plate is incident and which is disposed on the light guide plate; a first insulating layer which covers the first insulating patterns; a plurality of second insulating patterns into which the guided light from the first insulating layer is incident and which is disposed on the first insulating layer; and a second insulating layer which covers the second insulating patterns. The light guide plate includes a light incident side surface at which the light source is disposed and through which the light from the light source is incident to the light guide plate, pairs of insulating patterns within the optical member each include one first insulating pattern and one second insulating pattern and in a top plan view, for each pair of insulating patterns within the optical member, the first insulating pattern is closer to the light incident side surface of the light guide plate than the second insulating pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
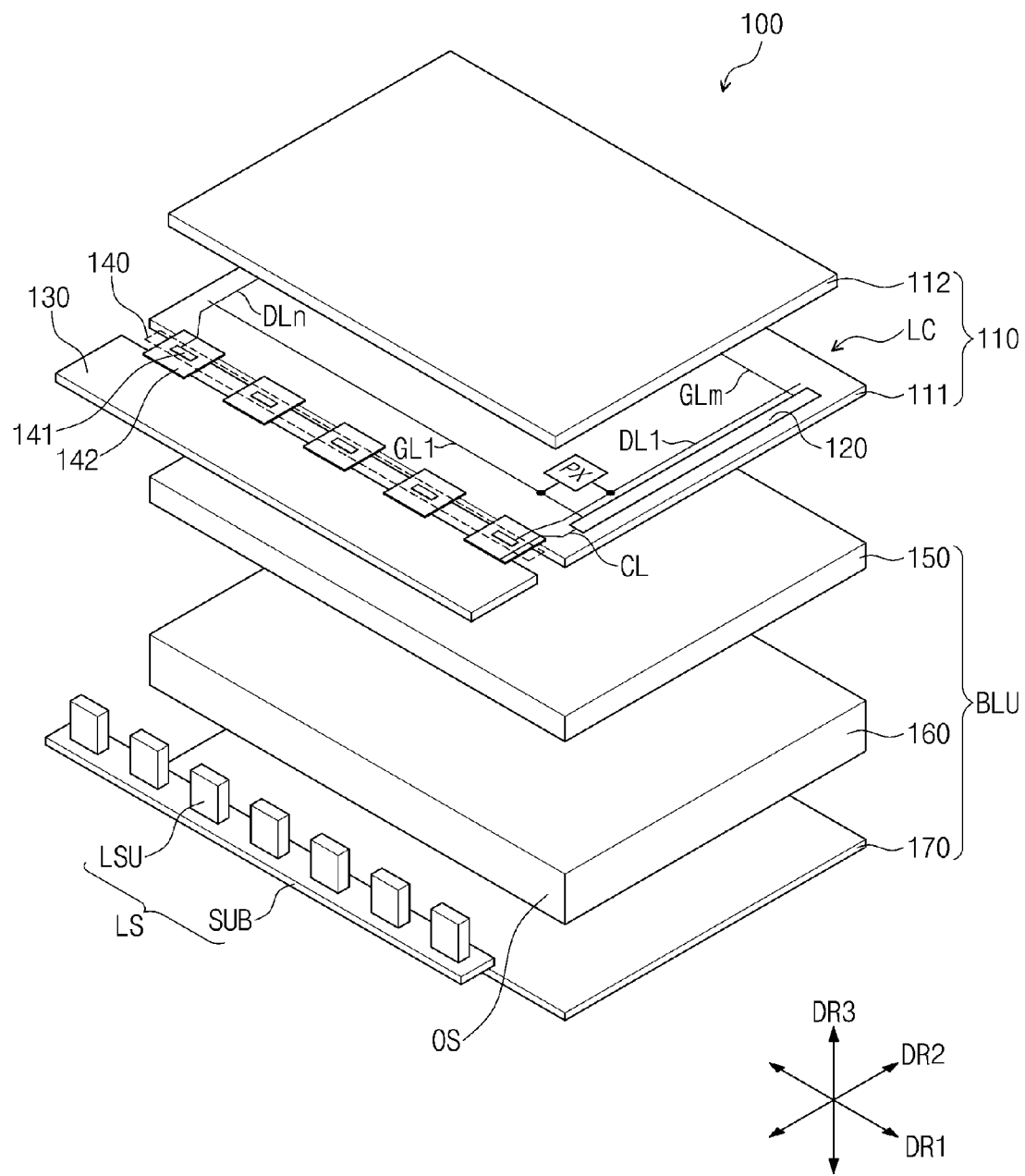
FIG. 1 is a perspective view of an exemplary embodiment of a display device according to the invention.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the invention will now be described more fully with reference to the accompanying drawings, in which example embodiments are shown. Example embodiments of the invention may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present. Like numbers indicate like elements throughout.

As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

An optical sheet of a backlight unit may include a collection of individual sheets such as a diffusion sheet for diffusing the light, a prism sheet, which is provided on the diffusion sheet to condense the light passing therethrough, and a protection sheet, which is provided on the prism sheet to protect the prism sheet. In general, the optical sheet including the plurality of individual sheets and has a total thickness of about 0.5 millimeter (mm). Due to the presence of the optical sheet within the backlight unit, the display device including such backlight unit may undesirably have an increased thickness.

FIG. 1 is a perspective view of an exemplary embodiment of a display device according to the invention.

Referring to FIG. 1, a display device 100 may include a display panel 110, a gate driver 120, a printed circuit board 130, a data driver 140 and a backlight unit BLU. The display panel 110 may have a relatively long side, which lengthwise extends in a first direction DR1, and a relatively short side, which lengthwise extends in a second direction DR2 crossing the first direction DR1. The backlight unit BLU may be configured to generate and condense light and to transmit the light to the display panel 110. The display panel 110 may use the light transmitted from the backlight unit BLU to display an image.

The display panel 110 may include a first (display) substrate 111, a second (display) substrate 112 facing the first substrate 111, and an image display layer such as a liquid crystal layer LC between the first and second substrates 111 and 112. A pixel PX provided in plurality, a plurality of gate lines GL1-GLm, and a plurality of data lines DL1-DLn may be provided in the first substrate 111 such as on a first base substrate thereof, where m and n are natural numbers. Although, for convenience in description, one pixel PX is illustrated in FIG. 1, a plurality of the pixels PX may be provided on the first substrate 111 such as on the first base substrate thereof. For convenience of explanation, reference numerals 111 and 112 may generally indicate a display substrate or the base substrate thereof.

The gate lines GL1-GLm and the data lines DL1-DLn may be electrically insulated from each other and may be provided to cross each other. The gate lines GL1-GLm may lengthwise extend in the first direction DR1 and may be connected to the gate driver 120. The data lines DL1-DLn may lengthwise extend in the second direction DR2 and may be connected to the data driver 140.

In an exemplary embodiment, the pixels PX may be respectively provided in regions, which are defined by the gate lines GL1-GLm and the data lines DL1-DLn, but the invention is not limited thereto. The pixels PX may be arranged in a matrix shape and may be connected to respective gate lines GL1-GLm and data lines DL1-DLn. The image may be generated and/or displayed with light at the pixels PX, under control of the gate driver 120 and the data drier 140. The pixels PX may be disposed in a display area of the display panel 110, at which the image is displayed. An area of the display panel 110 except for the display area may define a non-display area of the display panel 110 at which the image is not displayed.

The gate driver 120 may be provided at a region of the first substrate 111 such as on the first base substrate thereof, which is adjacent to a side of the first substrate 111 in the first direction DR1. In an exemplary embodiment of manufacturing a display device, elements and/or layers of the gate driver 120 may be formed at the same time using the same process as that for elements and/or layers (e.g., a thin film transistor ("TFT")) of the pixels PX. In some embodiments, the gate driver 120 may be mounted on the first base substrate of the first substrate 111 an amorphous silicon TFT gate driver circuit ("ASG") method or an oxide silicon TFT gate driver circuit ("OSG") method.

However, the invention is not limited thereto, and the gate driver 120 may be or include, for example, one of a plurality of driver chips that are mounted on a flexible printed circuit board and are connected to the first substrate 111 in a tape carrier package ("TCP") method. In certain embodiments, the gate driver 120 may be or include one of a plurality of driver chips that are mounted on the first substrate 111 in a chip-on-glass (COG) method.

A timing controller (not shown) may be provided on the printed circuit board 130. The timing controller may be an integrated circuit chip, which is mounted on the printed circuit board 130, and may be connected to the gate driver 120 and the data driver 140. The timing controller may be configured to output a gate control signal, a data control signal, and image data to control operation of the display panel 110, such as the pixels PX thereof.

The gate driver 120 may receive the gate control signal from the timing controller through a control line CL. The gate driver 120 may be configured to generate a plurality of gate signals in response to the gate control signal and sequentially output the gate signals. The gate signals are applied to the pixels PX through the gate lines GL1 to GLm in the unit of row. As a result, the pixels PX are driven in the unit of row, to display the image.

The data driver 140 may include a source driving chip 141 provided in plurality and a flexible circuit board 142 provided in plurality. The source driving chips 141 may be mounted on flexible circuit boards 142, respectively. The flexible circuit boards 142 may be connected to a side region of the first substrate 111, when viewed in the second direction DR2, and to the printed circuit board 130. In an exemplary embodiment, for example, the data driver 140 may be connected to the first substrate 111 and the printed circuit board 130 in a tape carrier package (TCP) manner. However, the invention is not limited thereto, and the source driving chips 141 of the data driver 140 may be mounted on the first substrate 111 in a chip-on-glass (COG) manner.

The data driver 140 may be configured to receive the image data and/or the data control signal from the timing controller. The data driver 140 may be configured to generate analog data voltages corresponding to the image data in response to the data control signal and then output the analog data voltages. The data voltages may be provided to the pixels PX through the data lines DL1-DLn.

The pixels PX may receive the data voltages through the data lines DL1-DLn, in response to the gate signals provided through the gate lines GL1-GLm. The pixels PX display grayscales corresponding to the data voltages, and thus the image is displayed.

The backlight unit BLU may be an edge-type backlight unit. The backlight unit BLU may include an optical member 150, a light guide plate 160, a light source LS, and a reflection sheet 170. Each of the optical member 150, the light guide plate 160, and the reflection sheet 170 may be provided to have a relatively long side parallel to the first direction DR1 and a relatively short side parallel to the second direction DR2.

The optical member 150 may be provided below the display panel 110, the light guide plate 160 may be provided below the optical member 150, and the reflection sheet 170 may be provided below the light guide plate 160. The light source LS may define a length thereof extended in the first direction DR1 and may be provided adjacent to a side surface OS of the light guide plate 160 in the second direction DR2.

The light guide plate 160 may include glass, but the invention is not limited thereto. In an exemplary embodiment, for example, the light guide plate 160 may be formed of or include a plastic material (e.g., polymethylmethacrylate ("PMMA")).

The light guide plate 160 includes a light exiting surface from which light exits the light guide plate 160, a rear surface opposite to the light exiting surface, and side surfaces which connect the light exiting surface and the rear surface to each other. Light generated in the light source LS may be incident into a side surface OS of the light guide plate 160. The light guide plate 160 may be configured to guide the light, which is incident from the light source LS, toward the display panel 110 or in an upward direction, where the upward direction may be perpendicular to both of the first and second directions DR1 and DR2.

The light source LS may include a light source substrate SUB having a length extending in the first direction DR1 and a light source unit LSU provided in plurality mounted on the light source substrate SUB. The light source units LSU may be provided to be spaced apart from each other along a length of the light source substrate SUB, in the first direction DR1 with a uniform distance therebetween. The light source units LSU may be provided to face the side surface OS of the light guide plate 160 in the second direction DR2. The light source units LSU may be configured to emit light, and the light emitted from the light source units LSU may be incident into the side surface OS of the light guide plate 160.

The reflection sheet 170 may be configured to reflect a part of the light, which propagates toward and through the rear surface of the light guide plate 160, back toward the display panel 110 or in the upward direction.

When the light, which is incident from the light guide plate 160, propagates in the upward direction, the optical member 150 may be configured to condense the light. The optical member 150 may also be configured to allow the light to propagate toward the display panel 110 or in the upward direction with uniform brightness distribution.

Hereinafter, the upward direction perpendicular to both of the first and second directions DR1 and DR2 will be referred to as a third direction DR3 or a normal direction. A thickness of the display device 100 or components thereof is taken along the third direction DR3. When measured in the third direction DR3, the optical member 150 may have a total thickness of about 4 micrometers (μm). The detailed structure of the optical member 150 will be described in more detail with reference to FIGS. 3 to 5.

Figure 2:
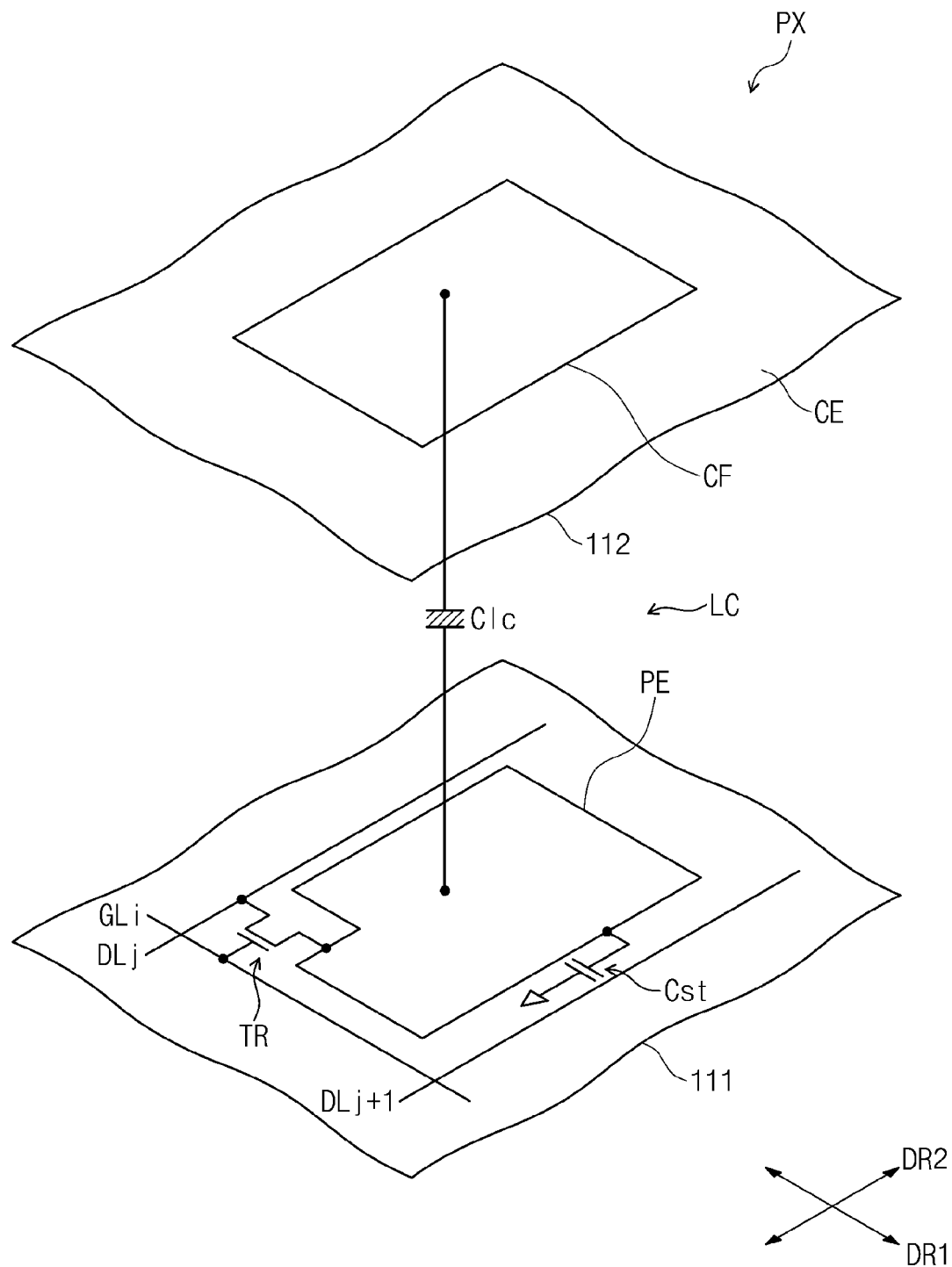
FIG. 2 is a schematic diagram illustrating an exemplary embodiment of a pixel of FIG. 1.

FIG. 2 is a schematic diagram illustrating an exemplary embodiment of the pixel of FIG. 1.

For convenience in description and illustration, FIG. 2 illustrates a pixel PX connected to the gate line GLi and the data line DLj, among data lines DLj and DLj+1. Although not shown, other pixels of the display panel 110 may be configured to have the same structure as that of the pixel PX shown in FIG. 2.

Referring to FIG. 2, the pixel PX may include a switching element such as a transistor TR connected to the gate line GLi and the data line DLj among data lines DLj and DLj+1, a liquid crystal capacitor Clc connected to the transistor TR, and a storage capacitor Cst connected in parallel to the liquid crystal capacitor Clc, where i and j are natural numbers. In certain embodiments, the storage capacitor Cst may be omitted.

The transistor TR may be provided in the first substrate 111 such as on the first base substrate thereof. The transistor TR may include a gate electrode connected to the gate line GLi, a source electrode connected to the data line DLj, and a drain electrode connected to the liquid crystal capacitor Clc and the storage capacitor Cst.

The liquid crystal capacitor Clc may include a pixel electrode PE provided on the first substrate 111, a common electrode CE provided in the second substrate 112 such as on the second base substrate thereof, and the liquid crystal layer LC disposed between the pixel and common electrodes PE and CE. The liquid crystal layer LC may serve as a dielectric layer. The pixel electrode PE may be connected to the drain electrode of the transistor TR.

Although FIG. 2 illustrates an example in which the pixel electrode PE has a non-slit structure, the pixel electrode PE may have a slit structure including a cross-shaped stem portion and a plurality of branches which extend radially from the stem portion.

The common electrode CE may be provided to cover substantially the entirety of the second substrate 112, but the invention is limited thereto. In an exemplary embodiment, for example, the common electrode CE may be provided in the first substrate 111 along with the pixel electrode PE. In this case, at least one of the pixel and common electrodes PE and CE may be configured to include a slit-shaped pattern.

The storage capacitor Cst may include the pixel electrode PE, a storage electrode (not shown) diverging from a storage line (not shown), and an insulating layer disposed between the pixel electrode PE and the storage electrode. The storage line may be provided in the first substrate 111 such as on the first base substrate thereof. In an exemplary embodiment of manufacturing a display device, the storage line and the gate lines GL1-GLm may be simultaneously formed such as from a same material layer, to be disposed in a same layer of the first substrate 111 among layers on the first base substrate thereof. The storage electrode may be partially overlapped with the pixel electrode PE.

The pixel PX may further include a color filter CF, which is configured to display one of red, green, and blue colors. In example embodiments, the color filter CF may be provided in the second substrate 112 such as on the second base substrate thereof, as shown in FIG. 2, but the invention is not limited thereto. In an exemplary embodiment, for example, in certain embodiments, the color filter CF may be provided in the first substrate 111.

The transistor TR may be turned on in response to a gate signal applied to the gate line GLi. If a data voltage is applied to the transistor TR via the data line DLj, the data voltage may be applied to the pixel electrode PE of the liquid crystal capacitor Clc via the turned-on transistor TR. In some embodiments, a common voltage may be applied to the common electrode CE.

Due to a difference in voltage level between the data voltage and the common voltage, an electric field may be produced between the pixel and common electrodes PE and CE. The electric field between the pixel and common electrodes PE and CE may be used to control motion or orientation of liquid crystal molecules in the liquid crystal layer LC. The change in motion or orientation of the liquid crystal molecules may be controlled to adjust optical transmittance of the liquid crystal layer LC, and this may be used to display an image.

A storage voltage of a constant level may be applied to the storage line, but the invention is not limited thereto. In an exemplary embodiment, for example, the common voltage may be applied to the storage line. The storage capacitor Cst compensates for the lack of the charging rate of the liquid crystal capacitor Clc.

Figure 3:
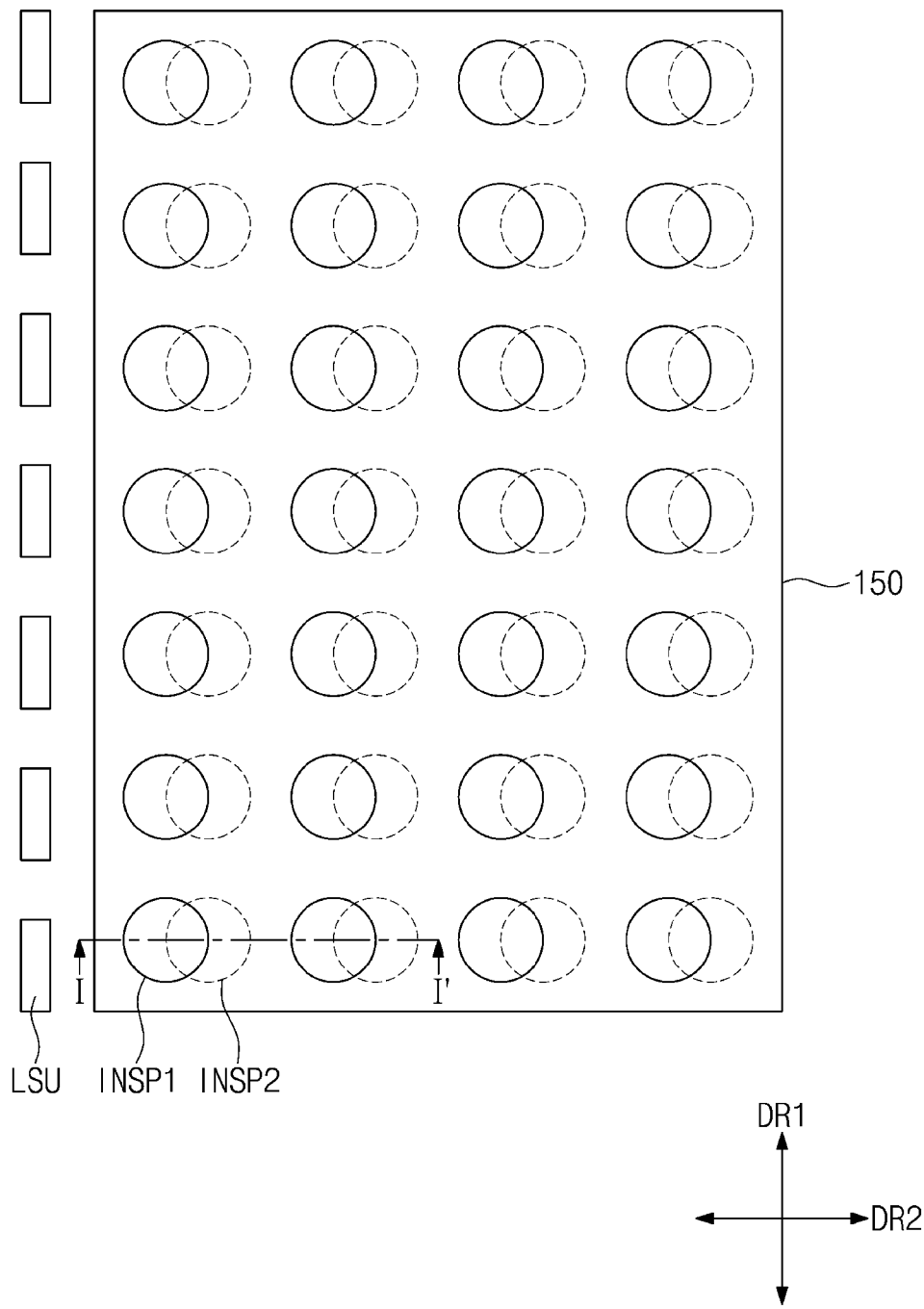
FIG. 3 is a top plan view illustrating an exemplary embodiment of an optical member of FIG. 1.
Figure 4:
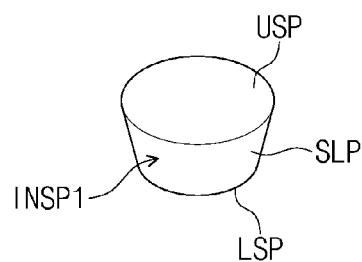
FIG. 4 is a perspective view illustrating an exemplary embodiment of an insulating pattern shown in FIG. 3.
Figure 5:
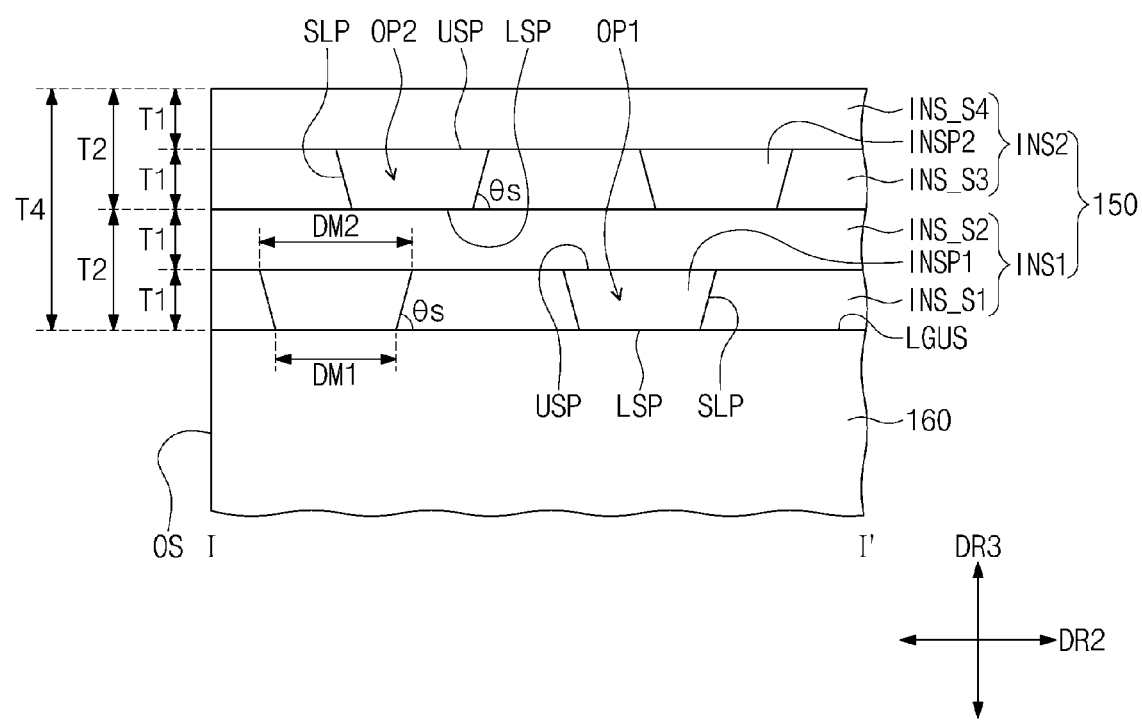
FIG. 5 is a cross-sectional view taken along line I-I' of FIG. 3.

FIG. 3 is a top plan view illustrating an exemplary embodiment of the optical member of FIG. 1. FIG. 4 is a perspective view illustrating an exemplary embodiment of an insulating pattern shown in FIG. 3. FIG. 5 is a cross-sectional view taken along line I-I' of FIG. 3.

Referring to FIGS. 3, 4 and 5, the optical member 150 may include a first insulating pattern INSP1 provided in plurality, a first insulating layer INS1, a second insulating pattern INSP2 provided in plurality, and a second insulating layer INS2.

The first insulating patterns INSP1 may be provided on the light guide plate 160, and the first insulating layer INS1 may be provided on the light guide plate 160 to surround and cover the first insulating patterns INSP1. The first insulating pattern INSP1 may be a discrete member within the first insulating layer INS1. The second insulating patterns INSP2 may be provided on the first insulating layer INS1, and the second insulating layer INS2 may be provided on the light guide plate 160 to surround and cover the second insulating patterns INSP2. The second insulating patterns INSP2 may be a discrete member within the second insulating layer INS2.

The first insulating patterns INSP1 may be provided to be paired with the second insulating patterns INSP2, respectively. In an exemplary embodiment, for example, the number of the first insulating patterns INSP1 may be equal to the number of the second insulating patterns INSP2, and the first and second insulating patterns INSP1 and INSP2 may be arranged in a one-to-one correspondence manner.

When viewed in a plan view taken parallel to an upper surface LGUS of the light guide plate 160, each of the first insulating patterns INSP1 may be positioned to be closer to the (incident) side surface OS of the light guide plate 160 than to a corresponding one of the second insulating patterns INSP2. In other words, in each corresponding pair of the first and second insulating patterns INSP1 and INSP2, a distance between the first insulating pattern INSP1 and the side surface OS may be smaller than that between the second insulating pattern INSP2 and the side surface OS. The upper surface LGUS of the light guide plate 160 may be disposed in a plane that is parallel to a plane defined by the first and second directions DR1 and DR2.

The first and second insulating patterns INSP1 and INSP2 may be inorganic insulating patterns that are formed of or include an inorganic material. The first and second insulating layers INS1 and INK may be organic insulating layers that are formed of or include an organic material. The light guide plate 160 may be formed or include an insulating material such as glass.

In an exemplary embodiment of manufacturing a display device, the first and second insulating patterns INSP1 and INSP2 may be formed of the same inorganic material, thereby having the same refractive index. In an exemplary embodiment, for example, the first and second insulating patterns INSP1 and INSP2 may be formed of silicon nitride (SiNx). In an exemplary embodiment of manufacturing a display device, the first and second insulating layers INS1 and INS2 may be formed of the same organic material, thereby having the same refractive index.

The inorganic material forming the first and second insulating patterns INSP1 and INSP2 may have a refractive index higher than that of the organic material forming the first and second insulating layers INS1 and INS2 except for the first and second insulating patterns INSP1 and INSP2 or the glass forming the light guide plate 160. Thus, the first and second insulating patterns INSP1 and INSP2 may have refractive indices that are each higher than those of the first and second insulating layers INS1 and INS2 except for the first and second insulating patterns INSP1 and INSP2 and of the light guide plate 160. The first and second insulating layers INS1 and INS2 except for the first and second insulating patterns INSP1 and INSP2 may have refractive indices that are each lower than or equal to that of the light guide plate 160. As an example, the first and second insulating patterns INSP1 and INSP2 may have a refractive index of about 1.8, the first and second insulating layers INS1 and INS2 except for the first and second insulating patterns INSP1 and INSP2 may have a refractive index of about 1.2, and the light guide plate 160 may have a refractive index of about 1.5.

The first insulating layer INS1 except for the first and second insulating patterns INSP1 and INSP2 may include a first sub-insulating layer INS_S1 defining a plurality of first openings OP1 and a second sub-insulating layer INS_S2 on the first sub-insulating layer INS_S1. The first openings OP1 may be empty regions of the first insulating layer INS1 that are formed in an exemplary embodiment of manufacturing a display device, by partially removing portions of a material layer for forming the first sub-insulating layer INS_S1, and the first insulating patterns INSP1 may be provided in the first openings OP1, respectively. The first sub-insulating layer INS_S1 is hereinafter considered as portions thereof except for the first insulating patterns INSP1. The second sub-insulating layer INS_S2 may be provided on the first sub-insulating layer INS_S1 and the first insulating patterns INSP1, to commonly cover each of the first insulating patterns INSP1.

The second insulating layer INS2 may include a third sub-insulating layer INS_S3 defining a plurality of second openings OP2 and a fourth sub-insulating layer INS_S4 on the third sub-insulating layer INS_S3. The second openings OP2 may be empty regions that are formed in an exemplary embodiment of manufacturing a display device, by partially removing portions of a material layer for forming the third sub-insulating layer INS_S3, and the second insulating patterns INSP2 may be provided in the second openings OP2, respectively. The third sub-insulating layer INS_S3 is hereinafter considered as portions thereof except for the second insulating patterns INSP2. The fourth sub-insulating layer INS_S4 may be provided on the third sub-insulating layer INS_S3 and the second insulating patterns INSP2, to commonly cover each of the second insulating patterns INSP2.

Since the first and second insulating layers INS1 and INK except for the first and second insulating patterns INSP1 and INSP2 have the same refractive index, the first, second, third and fourth sub-insulating layers INS_S1, INS_S2, INS_S3, and INS_S4 may be formed of the same organic material and thus may have the same refractive index as each other.

The first insulating patterns INSP1 may have the same (two-dimensional and three-dimensional) shape and size as the second insulating patterns INSP2. Each of the first and second insulating patterns INSP1 and INSP2 may have a reversed trapezoidal shape in cross-section. For convenience in description and illustration, in FIG. 3, planar shapes of the second insulating patterns INSP2 are illustrated by dotted lines.

For convenience of description and illustration, FIG. 4 illustrates a first insulating pattern INSP1, but the same features described therefore apply to a second insulating pattern INSP2. Each of the first and second insulating patterns INSP1 and INSP2 may include a lower surface portion LSP provided on the light guide plate 160 to interface with the upper surface LGUS thereof, an upper surface portion USP located above the lower surface portion LSP in cross-section and further from the light guide plate 160 than the lower surface portion LSP, and a side surface portion SLP connecting the lower surface portion LSP to the upper surface portion USP. The lower surface portion LSP and the upper surface portion USP may have a circular shape in the top plan view, as shown in FIG. 3. In a plane parallel to that defined by the first and/or second directions DR1 and DR2, a diameter or width (hereinafter, a first diameter DM1) of the lower surface portion LSP may be smaller than a diameter or width (hereinafter, a second diameter DM2) of the upper surface portion USP. The diameter or width may be a maximum of the respective dimension.

The side surface portion SLP may be an inclined surface that is inclined at an angle of θs to the upper surface LGUS of the light guide plate 160. In an exemplary embodiment, for example, the angle θs between the side surface portion SLP and the upper surface LGUS of the light guide plate 160 may range from about 60 degrees (°) to about 75°.

A direction normal to the upper surface LGUS of the light guide plate 160 may be parallel to the third direction DR3. When measured in the third direction DR3, each of the first and second insulating patterns INSP1 and INSP2 may have a first thickness T1. A ratio of the first thickness T1 to the first diameter DM1 may be given as 1:2. The first thickness T1 may be a maximum distance between the upper surface portion USP and the lower surface portion LSP of a respective insulating pattern.

When measured in the third direction DR3, each of the first and third sub-insulating layers INS_S1 and INS_S3 may have the same thickness (e.g., the first thickness T1) as that of the first and second insulating patterns INSP1 and INSP2. Also, each of the second and fourth sub-insulating layers INS_S2 and INS_S4 may have the same thickness (i.e., the first thickness T1) as that of the first and second insulating patterns INSP1 and INSP2.

Each of the first and second insulating layers INS1 and INS2 may have a total second thickness T2 that is two times the first thickness Ti, and the optical member 150 may have a total fourth thickness T4 that is four times the first thickness T1. The second and fourth thicknesses T2 and T4 may be a maximum distance between respective upper and lower surfaces of the respective insulating layer or sub-insulating layer.

In some embodiments, the maximum thickness of each of the first and second insulating patterns INSP1 and INSP2 may be about 1 micrometer (μm), total the thickness of each of the first and second insulating layers INS1 and INS2 may be about 2 μm, and the maximum diameter of the lower surface portion LSP of each of the first and second insulating patterns INSP1 and INSP2 may be about 2 μm. The total thickness of the optical member 150 may be about 4 μm.

The greater a total thickness of a structure located on a propagation path of light, the higher the optical loss. Since a conventional optical sheet including a collection of individual sheets such as a diffusion sheet, a prism sheet, and a protection sheet is relatively thicker than the optical member 150 according to one or more embodiment of the invention, the optical loss in the conventional optical sheet may be increased. By contrast, since one or more embodiment of the optical member 150 has a total thickness smaller than that of the conventional optical sheet, the optical loss in the optical member 150 may be reduced.

As shown in FIG. 3, the first insulating patterns INSP1 and the second insulating patterns INSP2 may be arranged in a plurality of rows and a plurality of columns or in a matrix shape, in the top plan view. But the invention is not limited thereto, and the arrangement of the first and second insulating patterns INSP1 and INSP2 may be variously changed.

In FIG. 3, the second direction DR2 may be defined as a row direction, and the first direction DR1 may be defined as a column direction. Each corresponding pair of the first and second insulating patterns INSP1 and INSP2 may be located at the same row. In other words, each corresponding pair of the first and second insulating patterns INSP1 and INSP2 may be arranged in the second direction DR2.

As shown in FIG. 3, when viewed in the top plan view of the upper surface LGUS of the light guide plate 160, each of the second insulating patterns INSP2 may be arranged to be partially overlapped with a corresponding one of the first insulating patterns INSP1. But the invention is not limited thereto, and in certain embodiments, according to the angle between the side surface portion SLP and the upper surface LGUS of the light guide plate 160, each of the second insulating patterns INSP2 may be arranged so as not to be overlapped with a corresponding one of the first insulating patterns INSP1. This configuration will be described in more detail with reference to FIGS. 6 and 7.

Figure 6:
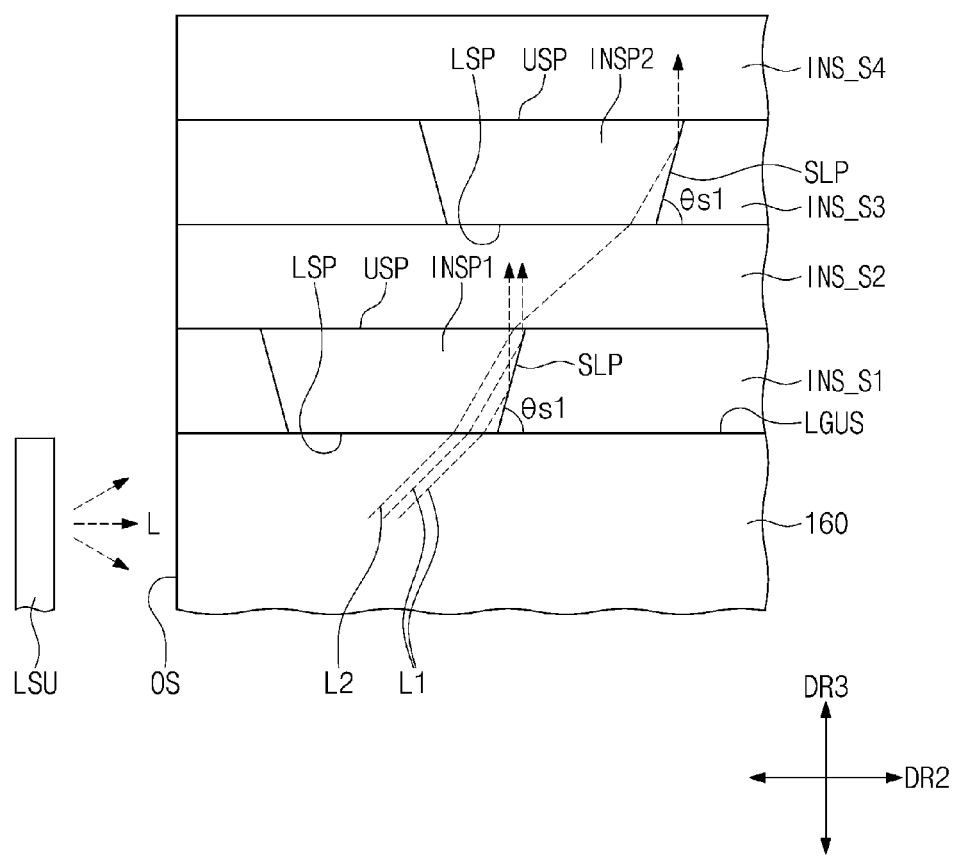
FIG. 6 is a diagram illustrating light propagation paths in an exemplary embodiment of a second insulating pattern overlapped with a first insulating pattern.
Figure 7:
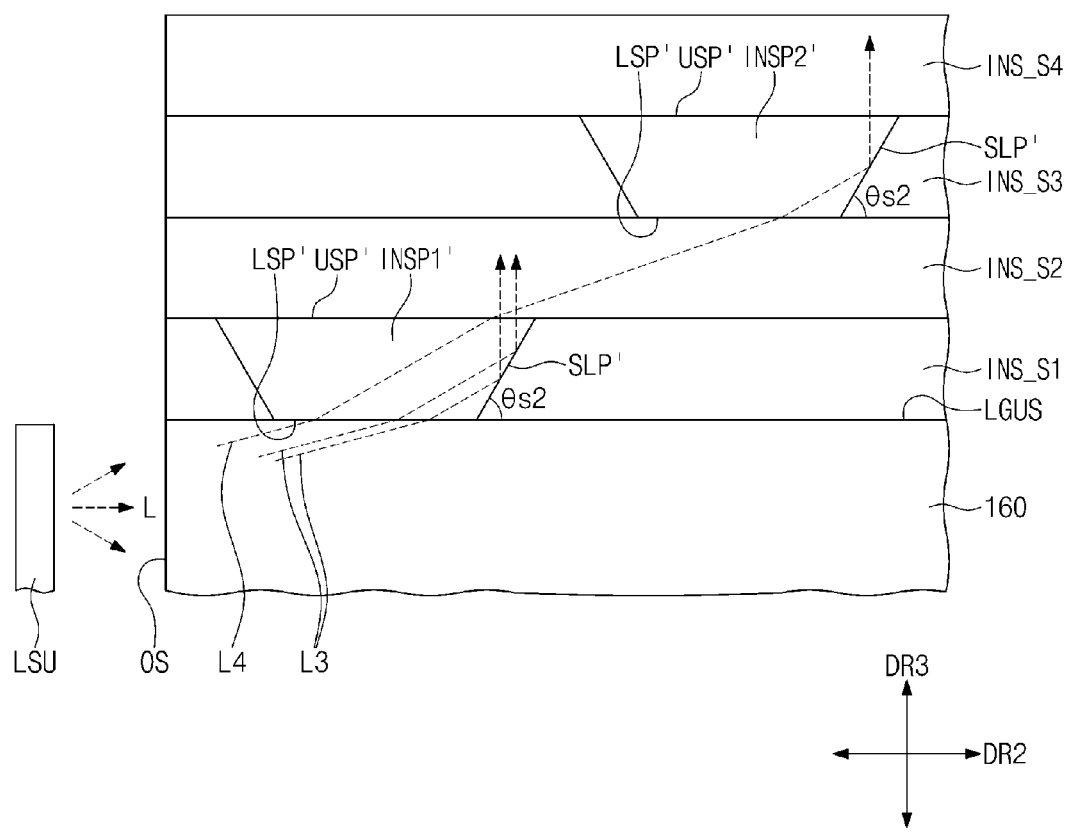
FIG. 7 is a diagram illustrating light propagation paths in an exemplary embodiment of a second insulating pattern not overlapped with a first insulating pattern.
Figure 8:
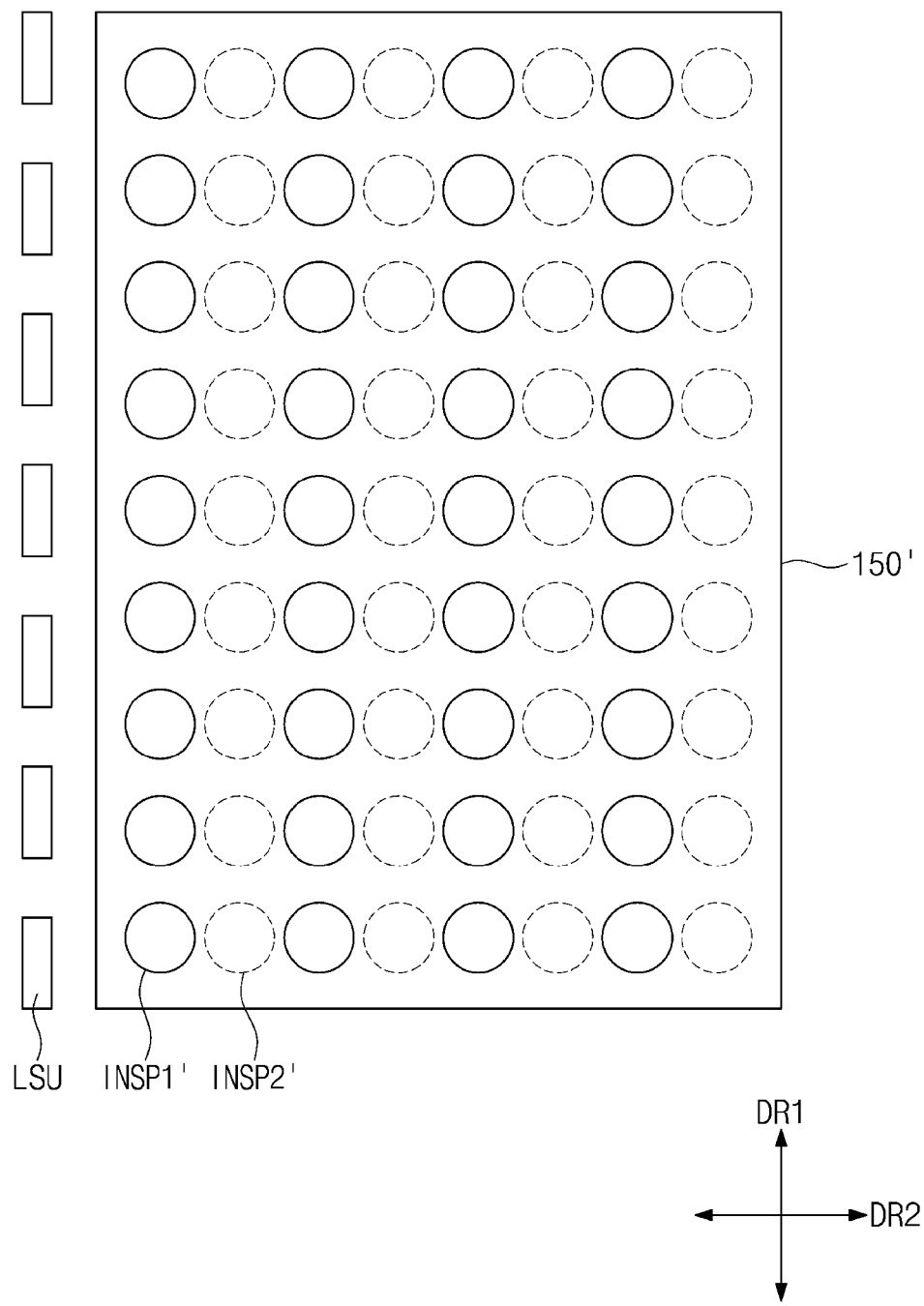
FIG. 8 is a top plan view of an optical member including the first and second insulating patterns shown in FIG. 7.

FIG. 6 is a diagram illustrating light propagation paths in an exemplary embodiment with a second insulating pattern overlapped with a first insulating pattern. FIG. 7 is a diagram illustrating light propagation paths in an exemplary embodiment with a second insulating pattern not overlapped with a first insulating pattern. FIG. 8 is a top plan view of an optical member including the first and second insulating patterns shown in FIG. 7.

For convenience in description and illustration, a pair including one of the first insulating patterns INSP1 and a pair including one of the second insulating patterns INSP2 are illustrated in FIG. 6, and one of first insulating patterns INSP1' and one of second insulating patterns INSP2' are illustrated in FIG. 7.

Referring to FIG. 6, the side surface portion SLP of each of the first and second insulating patterns INSP1 and INSP2 may be inclined at a first angle θs1 relative to the upper surface LGUS of the light guide plate 160. In some embodiments, the first angle θs1 may range from about 65° to about 75°, and in the embodiment of FIG. 6, the first angle θs1 may be about 75°. For convenience in description and illustration, the first angle θs1 of FIG. 6 is set to be the same as the angle θs of FIG. 5. In this case, when viewed in a top plan view of the upper surface LGUS of the light guide plate 160, the second insulating pattern INSP2 may be arranged to be partially overlapped with a corresponding one of the first insulating patterns INSP1.

Light L generated in the light source unit LSU and emitted therefrom may be incident to the light guide plate 160 through the side surface OS of the light guide plate 160. As shown in FIG. 6, one or more of a first light L1 and a second light L2 may be incident into different regions of the upper surface LGUS of the light guide plate 160 from an inner area thereof, and may have the same incident angle relative to the upper surface LGUS of the light guide plate 160.

The first insulating pattern INSP1 may have a refractive index higher than that of the light guide plate 160. Thus, the first light L1, which is a fraction of the total light L incident into the light guide plate 160, may be refracted at an interface between the upper surface LGUS of the light guide plate 160 and the lower surface portion LSP of the first insulating pattern INSP1, and then may propagate into the first insulating pattern INSP1.

The first insulating pattern INSP1 may have a refractive index higher than that of the first sub-insulating layer INS_S1. An incident angle of the first light L1 propagating into the first insulating pattern INSP1 may be within a range allowing for total reflection of the first light L1 at an interface between the side surface portion SLP of the first insulating pattern INSP1 and the first sub-insulating layer INS_S1. Thus, the first light L1 propagating into the first insulating pattern INSP1 may be totally reflected by the interface between the side surface portion SLP of the first insulating pattern INSP1 and the first sub-insulating layer INS_S1 and then may propagate in an upper direction or in the third direction DR3, to be emitted from the first insulating pattern INSP1.

The second light L2, which is another fraction of the total light L incident into the light guide plate 160, may be refracted at an interface between the upper surface LGUS of the light guide plate 160 and the lower surface portion LSP of the first insulating pattern INSP1 and then may be incident into the first insulating pattern INSP1. The second light L2 incident into the first insulating pattern INSP1 may not reach the interface between the side surface portion SLP of the first insulating pattern INSP1 and the first sub-insulating layer INS_S1. Such second light is emitted from the first insulating pattern INSP1 without reflection thereby.

An incident angle of the second light L2 may be within a range preventing the total reflection of the second light L2 from occurring at the interface between the first insulating pattern INSP1 and the second sub-insulating layer INS_S2. Thus, the second light L2 incident into the first insulating pattern INSP1 may be refracted at the interface between the first insulating pattern INSP1 and the second sub-insulating layer INS_S2 and then may be incident into the second sub-insulating layer INS_S2.

The second insulating pattern INSP2 may have a refractive index higher than that of the second sub-insulating layer INS_S2. Thus, the second light L2 incident into the second sub-insulating layer INS_S2 may be refracted at the interface between the second sub-insulating layer INS_S2 and the lower surface portion LSP of the second insulating pattern INSP2 and may be incident into the second insulating pattern INSP2.

The second insulating pattern INSP2 may have a refractive index higher than that of the third sub-insulating layer INS_S3. An incident angle of the second light L2 incident into the second insulating pattern INSP2 may be within a range allowing for total reflection of the second light L2 at an interface between the side surface portion SLP of the second insulating pattern INSP2 and the third sub-insulating layer INS_S3. Thus, the second light L2 propagating into the second insulating pattern INSP2 may be totally reflected by the interface between the side surface portion SLP of the second insulating pattern INSP2 and the third sub-insulating layer INS_S3 and then may propagate in the third direction DR3 or the upper direction, to be emitted from the second insulating pattern INSP2.

The first light L1 may be totally reflected by the side surface portion SLP of the first insulating pattern INSP1 and may propagate in the upper direction, and the second light L2, which does not reach the side surface portion SLP of the first insulating pattern INSP1, may be totally reflected by the side surface portion SLP of the second insulating pattern INSP2 and may propagate in the upper direction. That is, owing to the second insulating pattern INSP2, it may be possible to allow light, which is incident into the first insulating pattern INSP1 but does not propagate in the upper direction, to eventually propagate in the upper direction to be emitted from the optical member in the upper direction. Thus, it may be possible to condense light propagating in the upper direction and to improve light emitting efficiency of the optical member 150.

Among portions of the side surface portion SLP relative to the light source unit LSU, the total reflection of the light L may occur at a first portion of the side surface portion SLP further from the light source unit LSU than at a second portion of the side surface portion SLP closer to the light source unit LSU than the first portion. A portion of the light propagating toward the second portion of the side surface portion SLP adjacent to the light source unit LSU may not propagate in the upper direction and may be lost. However, such optical loss may be very low, when compared with the optical loss in the conventional optical sheet. Accordingly, light emitting efficiency of one or more embodiment of the optical member 150 may be substantially higher than that of the conventional optical sheet.

Referring to FIGS. 7 and 8, a side surface portion SLP' of each of first and second insulating patterns INSP1' and INSP2' of optical member 150' may be inclined at a second angle θs2 relative to the upper surface LGUS of the light guide plate 160, where the second angle θs2 may be less than the first angle θs1. In an exemplary embodiment, for example, the second angle θs2 may range from about 60° to about 65°, and in the embodiment of FIG. 7, the second angle θs2 may be about 60°.

As shown in FIG. 7, a third light L3 and a fourth light L4 may be incident into different regions of the upper surface LGUS of the light guide plate 160 from an inner area thereof, and may have the same incident angle relative to the upper surface LGUS of the light guide plate 160. As shown in FIG. 8, when viewed in a plan view of the upper surface LGUS of the light guide plate 160, the second insulating pattern INSP2' may not overlap with a corresponding one of the first insulating patterns INSP1'.

Since the second angle θs2 is less than the first angle θs1, the light, which is totally reflected by the side surface portion SLP' of the first insulating pattern INSP1' and propagates in the upper direction, may have a propagation path different from that described with reference to FIG. 6. If the angle between the side surface portion SLP' and the upper surface LGUS of the light guide plate 160 is decreased, light, which propagates toward the upper surface LGUS of the light guide plate 160 with an angle smaller than the angle between the upper surface LGUS of the light guide plate 160 and the first and second lights L1 and L2, may be totally reflected by the side surface portion SLP' of the first insulating pattern INSP1' and then propagate in the upper direction.

In an exemplary embodiment, for example, angles between the third and fourth lights L3 and L4 (FIG. 7), and the upper surface LGUS of the light guide plate 160, may be smaller than the angle between the first and second lights L1 and L2 (FIG. 6), and the upper surface LGUS of the light guide plate 160. In this case, the third light L3 may be refracted at an interface between the upper surface LGUS of the light guide plate 160 and the lower surface portion LSP' of the first insulating pattern INSP1', may be totally reflected by the side surface portion SLP' of the first insulating pattern INSP1', and then may propagate in the upper direction.

The fourth light L4 may be refracted at the interface between the upper surface LGUS of the light guide plate 160 and the lower surface portion LSP' of the first insulating pattern INSP1' and then may be incident into the first insulating pattern INSP1', but it may not reach an interface between the side surface portion SLP' of the first insulating pattern INSP1' and the first sub-insulating layer INS_S1, to be emitted from the first insulating pattern INSP1'. The fourth light L4 incident into the first insulating pattern INSP1' may be refracted at an interface between the first insulating pattern INSP1' and the second sub-insulating layer INS_S2 and then may be incident into the second sub-insulating layer INS_S2.

The angle between the fourth light L4 and the upper surface LGUS of the light guide plate 160 may be smaller than the angle between the second light L2 and the upper surface LGUS of the light guide plate 160, and thus, in the case where the second insulating pattern INSP2' is provided at the same position as that of the second insulating pattern INSP2 of FIG. 6, the fourth light L4 may not reach the side surface portion SLP' of the second insulating pattern INSP2'. Accordingly, in order to allow the fourth light L4 to reach the side surface portion SLP' of the second insulating pattern INSP2', it may be necessary to further shift the second insulating pattern INSP2' in a right direction (e.g., further away from the light source unit LSU), compared with the second insulating pattern INSP2 shown in FIG. 6.

In other words, if the angle θs between the side surface portion SLP and the upper surface LGUS of the light guide plate 160 is decreased, the position of the second insulating pattern INSP2 may be further shifted in the right direction away from the light source unit LSU, and in this case, an overlapping area between the second insulating pattern INSP2 and the first insulating pattern INSP1 may be decreased. Furthermore, in the case where the angle θs between the side surface portion SLP and the upper surface LGUS of the light guide plate 160 becomes lower than a specific angle, the second insulating pattern INSP2' may not be overlapped with the first insulating pattern INSP1', as shown in FIGS. 7 and 8.

In some embodiments, in the case where the angle θs between the side surface portion SLP and the upper surface LGUS of the light guide plate 160 ranges from about 65° to about 75°, the first insulating pattern INSP1 may be partially overlapped with a corresponding one of the second insulating patterns INSP2, as shown in FIGS. 3 and 6. Furthermore, in the case where the angle θs between the side surface portion SLP and the upper surface LGUS of the light guide plate 160 ranges from about 60° to about 65°, the first insulating pattern INSP1' may not be overlapped with a corresponding one of the second insulating patterns INSP2', as shown in FIGS. 7 and 8.

The fourth light L4 propagating toward or within the second sub-insulating layer INS_S2 may be refracted at an interface between the second sub-insulating layer INS_S2 and the lower surface portion LSP' of the second insulating pattern INSP2' and then may be incident into the second insulating pattern INSP2'. The fourth light L4 propagating within the second insulating pattern INSP2' may be totally reflected by an interface between the side surface portion SLP' of the second insulating pattern INSP2' and the third sub-insulating layer INS_S3 and then may propagate in the upper direction, to be emitted from the second insulating pattern INSP2.

According to some embodiments of the invention, the backlight unit BLU and the display device 100 may include the optical member 150, which is configured to condense light propagating in the upper direction. Thus, the optical member 150 may have a relatively slim structure and may have improved light emitting efficiency as compared to a thickness of a conventional optical sheet. As a result, an overall thickness of the display device 100 may be reduced.

FIGS. 9 to 17 are cross-sectional views illustrating an exemplary embodiment of a method of fabricating an optical member of a display device, according to the invention.

For convenience in description and illustration, the fabrication method illustrated in FIGS. 9 to 17 will be described with reference to cross-sections corresponding to line I-I' of FIG. 3, similar to the cross-sectional view of FIG. 5.

Figure 9:
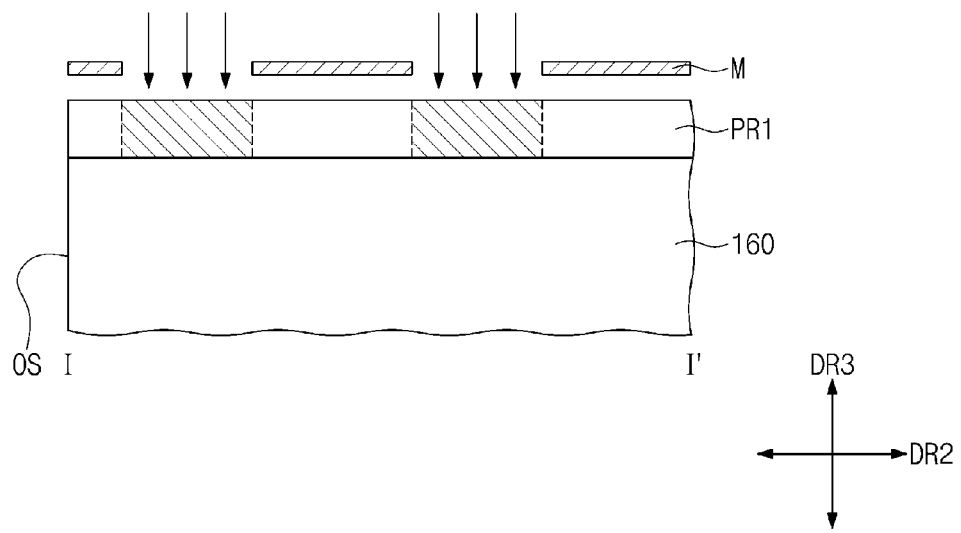
FIGS. 9 to 17 are cross-sectional views illustrating an exemplary embodiment of a method of fabricating an optical member of a display device, according to the invention.
Figure 10:
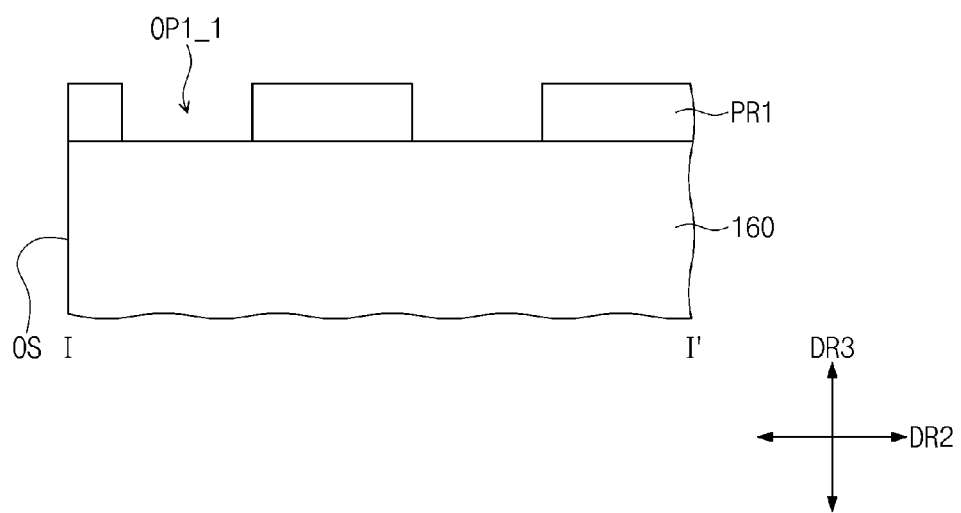

Referring to FIGS. 9 and 10, a first photoresist material layer (labeled as PR1 in FIG. 9) may be formed on the light guide plate 160, and then, a photomask M may be disposed to expose regions of the first photoresist material layer (indicated by downward arrows and hatched pattern areas of the first photoresist material layer). The first photoresist material layer may be formed of or include an organic material, in which a photosensitive resin is contained.

The regions of the first photoresist material layer exposed by the photomask M may be regions corresponding to the first openings OP1 (refer to FIG. 5). Exposure and developing processes may be performed to remove the regions of the first photoresist material layer exposed by the photomask M, and thus, a plurality of first sub-openings OP1_1 may be formed by patterns of the first photoresist PR1. The upper surface LGUS of the light guide plate 160 is exposed at area where regions of the first photoresist material layer are removed.

Figure 11:
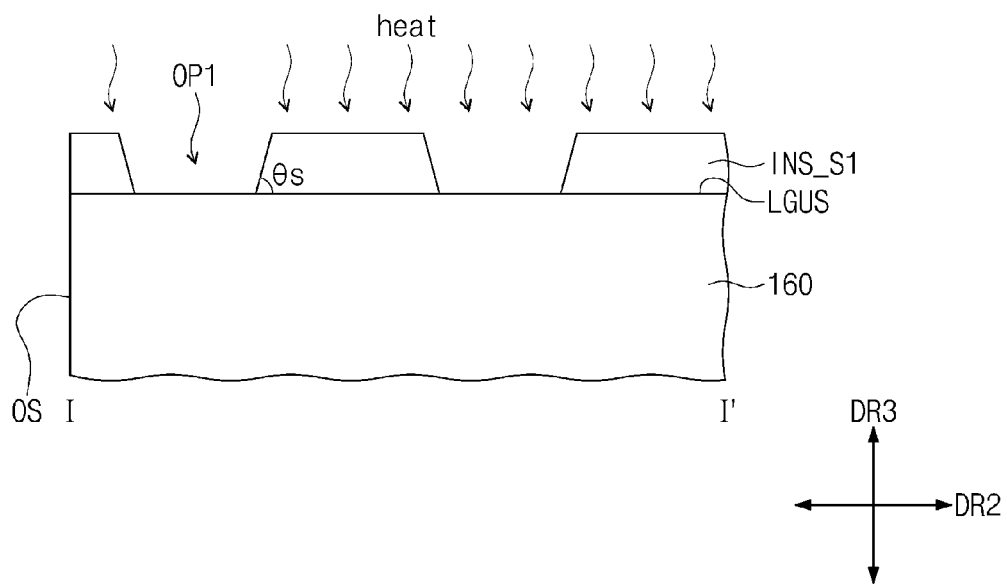

Referring to FIG. 11, a preliminary hardening process (indicated by 'heat' in FIG. 11) may be performed on the first photoresist PR1 having patterns thereof and the first sub-openings OP1_1 therebetween. During the preliminary hardening process, the first photoresist PR1 may be heated up to a temperature of about 130 degrees Celsius (° C.) to about 149° C. In this case, the first photoresist PR1 may be in a flowable state, portions of the first photoresist material patterns at the first sub-openings OP1_1 flow towards the light guide plate 160. Thus, side surfaces of the first photoresist PR1 at the first sub-openings OP1_1 thereof may have an inclined shape.

After the preliminary hardening process, a hardening process may be performed on the first photoresist PR1 having side surfaces thereof inclined relative to the upper surface LGUS of the light guide plate 160. In some embodiments, during the hardening process, the first photoresist PR1 may be heated up to a temperature of about 200° C. or higher, and as a result, the first photoresist PR1 may be hardened to have the side surfaces thereof inclined relative to the upper surface LGUS of the light guide plate 160.

The hardened first photoresist PR1 may be used as the first sub-insulating layer INS_S1 of the optical member 150, and the first sub-openings OP1_1 of the hardened first photoresist PR1 may be used as the first openings OP1 of the optical member 150. As a result, the first sub-insulating layer INS_S1 with the first openings OP1 may be provided on the light guide plate 160. Each of side surfaces of the first sub-insulating layer INS_S1 at the first openings OP1 thereof may be inclined at an angle θs to the upper surface LGUS of the light guide plate 160. The first sub-insulating layer INS_S1 may be formed to have a total thickness of about 1 μm.

Figure 12:
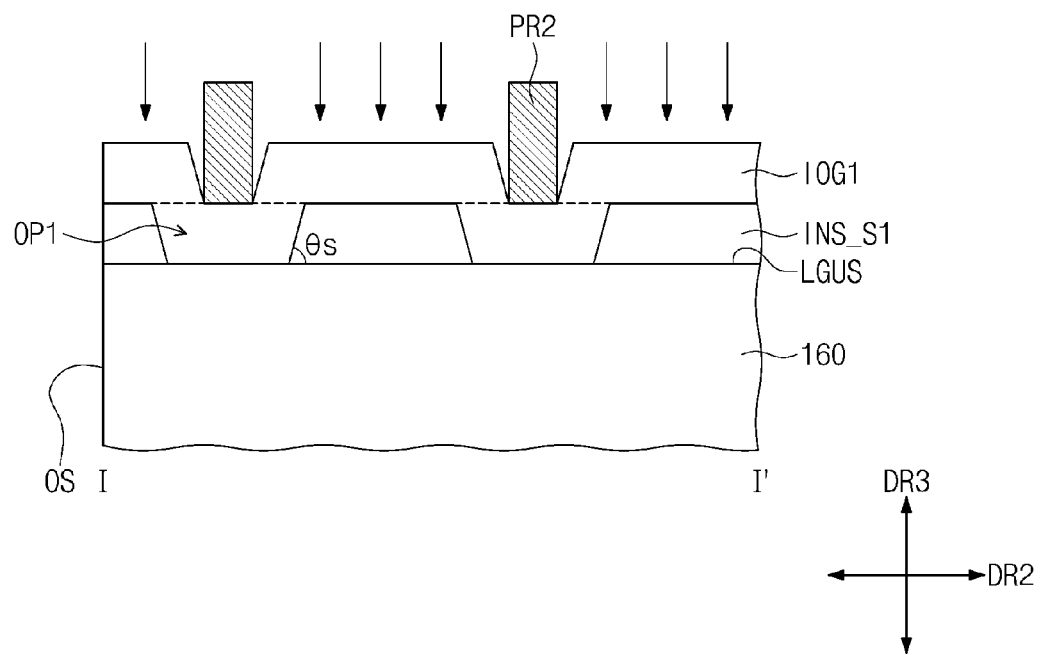

Referring to FIG. 12, a first inorganic insulating (material) layer IOG1 may be provided on the first sub-insulating layer INS_S1 and portions of the upper surface LGUS of the light guide plate 160 exposed by the first openings OP1. The first inorganic insulating layer IOG1 may be formed of or include an inorganic insulating material. The first inorganic insulating layer IOG1 may be deposited to cover the first sub-insulating layer INS_S1 and the portions of the upper surface LGUS of the light guide plate 160 exposed by the first openings OP1, to have a total thickness of about 1 μm. Owing to the recessed shape of the first openings OP1, portions of the first inorganic insulating layer IOG1 may be disposed below an upper surface of the first sub-insulating layer INS_S1 (e.g., to fill the first openings OP1) and remaining portions of the first inorganic insulating layer IOG1 may be disposed above the upper surface of the first sub-insulating layer INS_S1. A recess or opening in the first inorganic insulating layer IOG1 is formed aligned with the first openings OP1.

Second photoresist layer patterns PR2 may be formed on an upper surface of the first inorganic insulating layer IOG1. In some embodiments, the second photoresist layer patterns PR2 may be formed to cover portions of the upper surface of the first inorganic insulating layer IOG1 positioned at a level equal to the upper surface of the first sub-insulating layer INS_S1. The first inorganic insulating layer IOG1 may be etched using the second photoresist layer patterns PR2 as an etch mask (indicated by the downward arrows in FIG. 12). In an exemplary embodiment, for example, the etching of the first inorganic insulating layer IOG1 may be performed by a dry etching process to remove portions of the first inorganic insulating layer IOG1 exposed by the second photoresist layer patterns PR2. A variety of known dry etching technologies may be used for the etching of the first inorganic insulating layer IOG1.

A thickness of the first inorganic insulating layer IOG1 to be removed in the dry etching process may be in proportion to a process time of the dry etching process. In the case where the first inorganic insulating layer IOG1 is deposited to a thickness of 1 μm, the first inorganic insulating layer IOG1 on the upper surface of the first sub-insulating layer INS_S1 may have a thickness of about 1 μm.

In the case where the dry etching process is performed for 120 seconds, portions of the first inorganic insulating layer IOG1 extended from the topmost surface of the first inorganic insulating layer IOG1 may be removed or recessed by a vertical thickness of 1 μm taken in a direction normal to the upper surface LGUS of the light guide plate 160. Here, the topmost surface of the first inorganic insulating layer IOG1 may be the upper portion of the first inorganic insulating layer IOG1 that is located between the second photoresist layer patterns PR2 and is extended parallel to the upper surface LGUS of the light guide plate 160, e.g., above the upper surface of first sub-insulating layer INS_S1. Thus, portions of the first inorganic insulating layer IOG1 located at a level higher than the upper surface of the first sub-insulating layer INS_S1 may be removed.

Figure 13:
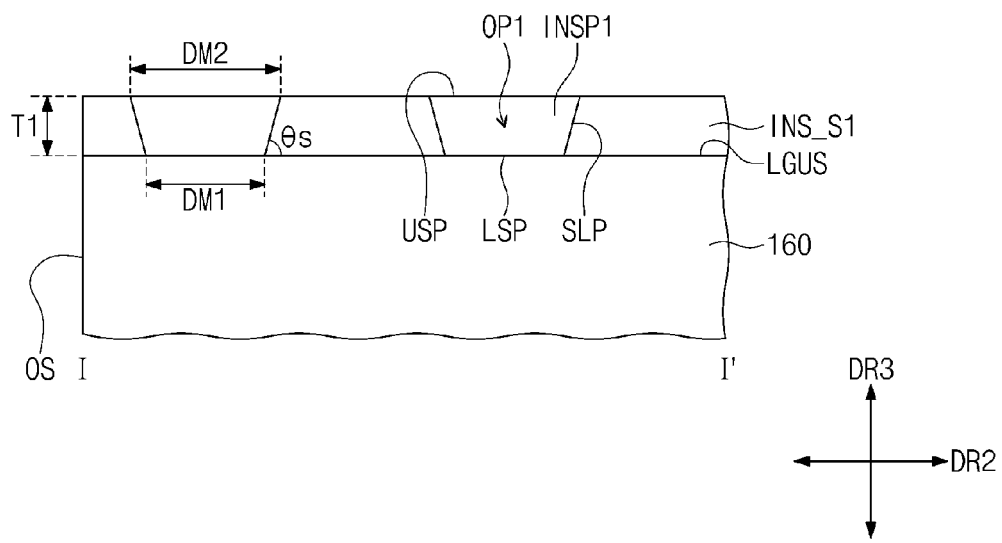

Referring to FIG. 13, since the portions of the first inorganic insulating layer IOG1 located at a level higher than the upper surface of the first sub-insulating layer INS_S1 are removed, a plurality of the first insulating patterns INSP1, which are formed of the first inorganic insulating (material) layer IOG1, may be formed in the first openings OP1, respectively. The side surface portion SLP of each of the first insulating patterns INSP1 may be inclined at an angle θs to the upper surface LGUS of the light guide plate 160, and the first insulating patterns INSP1 may have a maximum thickness of about 1 µm.

Figure 14:
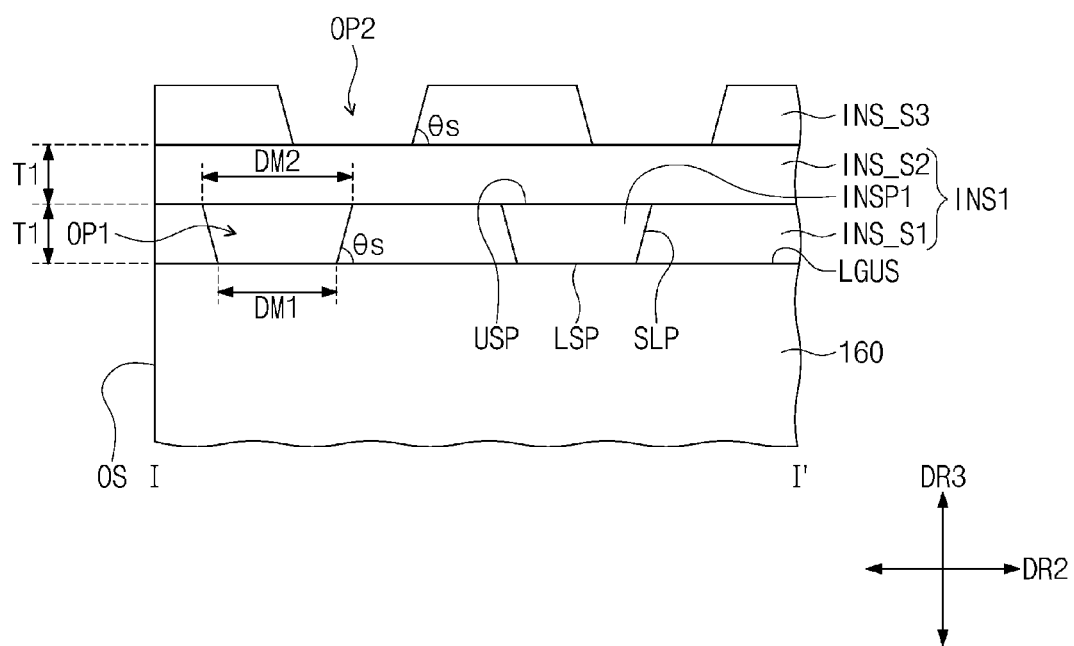

Referring to FIG. 14, the second sub-insulating layer INS_S2 may be formed on the first sub-insulating layer INS_S1 and the first insulating patterns INSP1, and then may be hardened. The third sub-insulating layer INS_S3 with a plurality of second openings OP2 may be formed on the second sub-insulating layer INS_S2. The plurality of second openings OP2 in the third sub-insulating layer INS_S3 may be formed by the same method as that for forming the first openings OP1 in the first sub-insulating layer INS_S1, and thus, a detailed description thereof will be omitted, for brevity's sake.

Although not shown, the formation of the third sub-insulating layer INS_S3 with the second openings OP2 may include forming a photoresist material layer on the first sub-insulating layer INS_S1 and the first insulating patterns INSP1, and then performing exposure and developing processes on regions of the photoresist material layer corresponding to the second openings OP2. Since the second sub-insulating layer INS_S2 has been already hardened, the second sub-insulating layer INS_S2 may not be affected, even when the exposure and developing processes are performed on the photoresist material layer formed on the first sub-insulating layer INS_S1 and the first insulating patterns INSP1.

Figure 15:
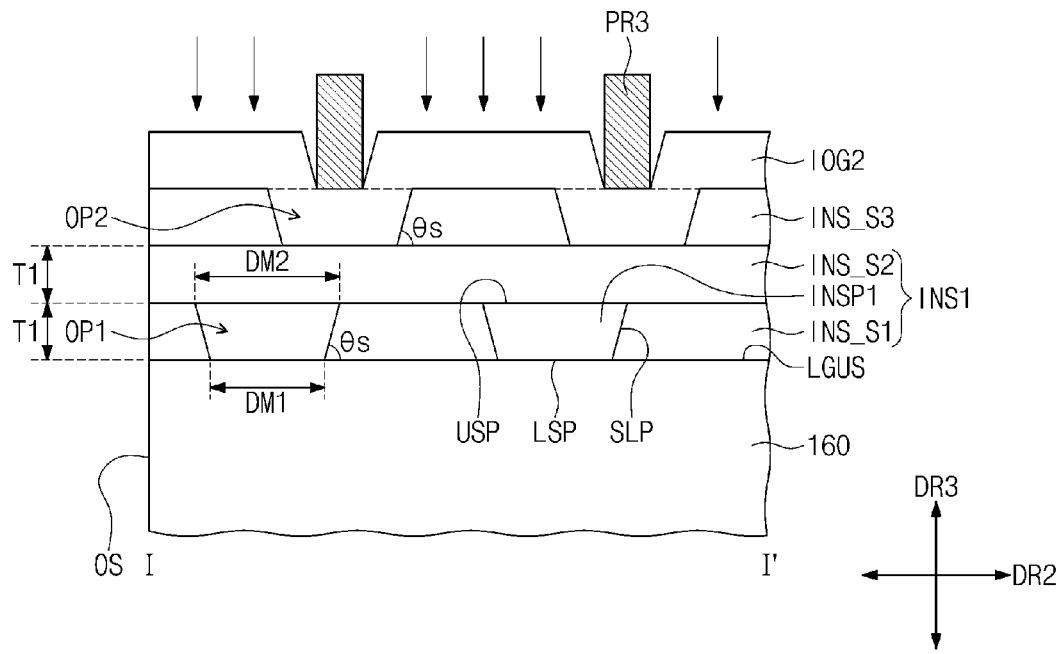
Figure 16:
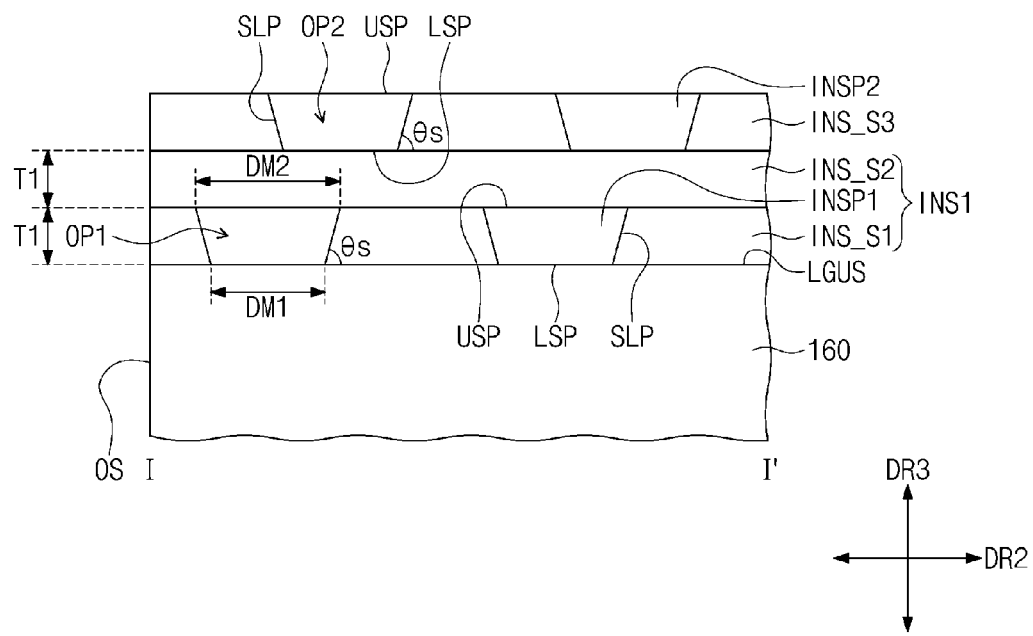

Referring to FIGS. 15 and 16, a second inorganic insulating (material) layer IOG2 may be provided on the third sub-insulating layer INS_S3 and portions of the second sub-insulating layer INS_S2 exposed by the second openings OP2. Owing to the recessed shape of the second openings OP2, portions of the second inorganic insulating layer IOG2 may be disposed below an upper surface of the third sub-insulating layer INS_S3 (e.g., to fill the second openings OP2) and remaining portions of the second inorganic insulating layer IOG2 may be disposed above the upper surface of the third sub-insulating layer INS_S3. A recess or opening in the second inorganic insulating layer IOG2 is formed aligned with the second openings OP2.

Third photoresist layer patterns PR3 may be formed on an upper surface of the second inorganic insulating layer IOG2, and in some embodiments, the third photoresist layer patterns PR3 may be formed to cover portions of the upper surface of the second inorganic insulating layer IOG2 positioned at a level equal to the upper surface of the third sub-insulating layer INS_S3.

The second inorganic insulating layer IOG2 may be etched using the third photoresist layer patterns PR3 as an etch mask (indicated by the downward arrows in FIG. 15). In an exemplary embodiment, for example, the etching of the second inorganic insulating layer IOG2 may be performed by a dry etching process to remove portions of the second inorganic insulating layer IOG2 exposed by the third photoresist layer patterns PR3. As a result, a plurality of the second insulating patterns INSP2, which are formed of the second inorganic insulating (material) layer IOG2, may be formed in the second openings OP2, respectively. The side surface portion SLP of each of the second insulating patterns INSP2 may be inclined at an angle θs to the upper surface LGUS of the light guide plate 160, and the second insulating patterns INSP2 may have a thickness of about 1 µm.

Figure 17:
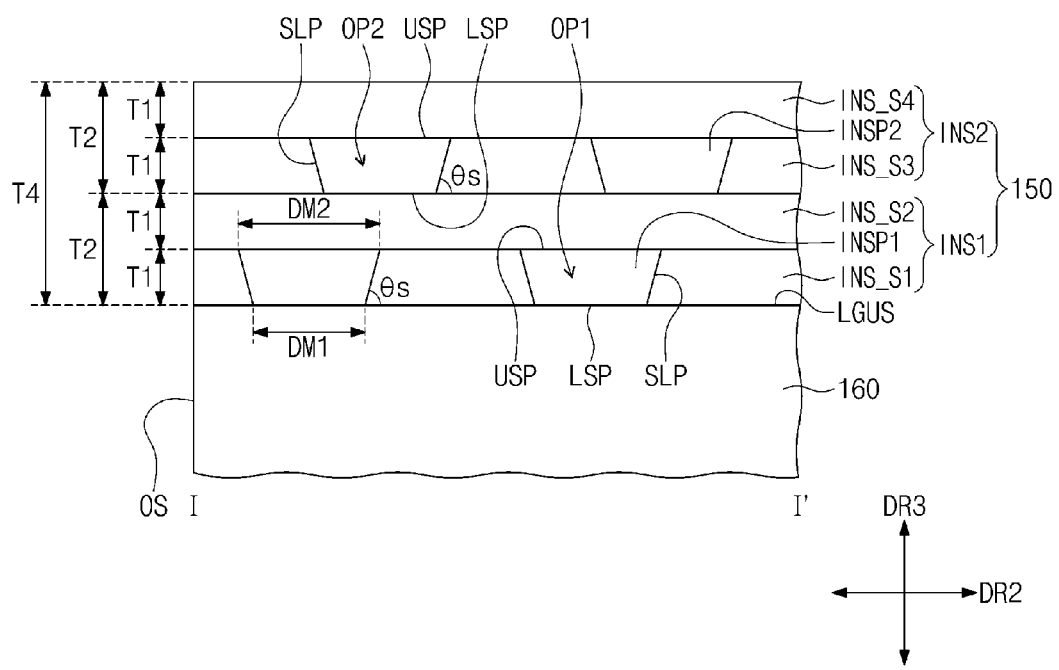

Referring to FIG. 17, the fourth sub-insulating layer INS_S4 may be formed on the third sub-insulating layer INS_S3 and the second insulating patterns INSP2, and thus, the optical member 150 may be fabricated.

According to one or more embodiment of the invention, a backlight unit of a display device may include plural layers of discrete optical structures within an optical member, which is configured to condense light transmitting in an upward direction. Thus, the optical member may have a relatively slim structure and may have increased light emitting efficiency. As a result, a total thickness of the display device including such backlight unit may be reduced.

While exemplary embodiments of the invention have been particularly shown and described, it will be understood by one of ordinary skill in the art that variations in form and detail may be made therein without departing from the spirit and scope of the attached claims.

What is claimed is:

1. A backlight unit, comprising:
a light source which generates light;
a light guide plate which guides the light from the light source and emits guided light through an upper surface of the light guide plate which faces a display panel which displays an image with the emitted light; and
an optical member disposed on the upper surface of the light guide plate to be between the light guide plate and the display panel and to refract the guided light from the upper surface of the light guide plate toward the display panel, the optical member comprising:
a plurality of first insulating patterns into which the guided light from the upper surface of the light guide plate is incident and which is disposed on the light guide plate;
a first insulating layer which covers the first insulating patterns;
a plurality of second insulating patterns into which the guided light from the first insulating layer is incident and which is disposed on the first insulating layer; and
a second insulating layer which covers the second insulating patterns,
wherein
the light guide plate includes a light incident side surface at which the light source is disposed and through which the light from the light source is incident to the light guide plate,
pairs of insulating patterns within the optical member each include one first insulating pattern and one second insulating pattern, and
in a top plan view, for each pair of insulating patterns within the optical member, the first insulating pattern is closer to the light incident side surface of the light guide plate than the second insulating pattern.

2. The backlight unit of claim 1, wherein
each of the first and second insulating patterns comprises an inorganic material, and
each of the first and second insulating layers comprises an organic material.

3. The backlight unit of claim 1, wherein
each of the first and second insulating patterns has a refractive index higher than that of the light guide plate,
each of the first and second insulating layers has a refractive index lower than or equal to that of the light guide plate,
the refractive indices of first and second insulating patterns are the same as each other, and
the refractive indices of the first and second insulating layers are the same as each other.

4. The backlight unit of claim 1, wherein the first insulating layer comprises:

a first sub-insulating layer defining a plurality of first openings in which the first insulating patterns are respectively disposed; and a second sub-insulating layer which disposes each of the first sub-insulating layer and the first insulating patterns between the light guide plate and the second sub-insulating layer.

5. The backlight unit of claim 4, wherein the second insulating layer comprises:
   a third sub-insulating layer defining a plurality of second openings in which the second insulating patterns are respectively disposed, the first insulating layer being between the third sub-insulating layer and the light guide plate; and
   a fourth sub-insulating layer which disposes each of the third sub-insulating layer and the second insulating patterns between the first insulating layer and the fourth sub-insulating layer, and
   in a direction normal to the upper surface of the light guide plate,
      respective thicknesses of each of the first and second insulating patterns are the same as each other, and
      respective thicknesses of each of the first, second, third and fourth sub-insulating layers are the same as each other.

6. The backlight unit of claim 1, wherein each of the first and second insulating patterns comprises:
   a lower surface and an upper surface which is further from the upper surface of the light guide plate than the lower surface, each of the lower and upper surfaces having a circular shape; and
   a side surface which connects the lower surface and the upper surface to each other,
   in a direction parallel to the upper surface of the light guide plate, a width of the lower surface is smaller than that of the upper surface, and
   in cross-section, the side surface is inclined at an angle relative to the upper surface of the light guide plate.

7. The backlight unit of claim 6, wherein the angle of the side surface relative to the upper surface of the light guide plate ranges from about 60° to about 75°.

8. The backlight unit of claim 6, wherein within each of the first and second insulating patterns, a ratio of a thickness thereof in a direction normal to the upper surface of the light guide plate and the width of the lower surface is about 1:2.

9. The backlight unit of claim 6, wherein
   in a direction normal to the upper surface of the light guide plate:
      a thickness of each of the first and second insulating patterns is about 1 micrometer,
      a thickness of each of the first and second insulating layers is about 2 micrometers, and
   the width of the lower surface of each of the first and second insulating patterns is about 2 micrometers.

10. The backlight unit of claim 6, wherein in the top plan view, for each pair of insulating patterns within the optical member, the second insulating pattern overlaps with the first insulating pattern.

11. The backlight unit of claim 10, wherein the angle of the side surface relative to the upper surface of the light guide plate ranges from about 65° to about 75°.

12. The backlight unit of claim 6, wherein in the top plan view, for each pair of insulating patterns within the optical member, the second insulating pattern does not overlap the first insulating pattern.

13. The backlight unit of claim 12, wherein the angle of the side surface relative to the upper surface of the light guide plate ranges from about 60° to about 65°.

14. The backlight unit of claim 1, wherein in the top plan view,
   the first insulating patterns and the second insulating patterns are each respectively arranged to form a plurality of rows and a plurality of columns within the optical member, and
   within each pair of insulating patterns of the optical member, the first and second insulating patterns are arranged in a same row.

15. A method of fabricating a backlight unit, comprising:
   forming an optical member on a light emitting surface of a light guide plate to dispose the optical member between the light guide plate and a display panel which displays an image with emitted light, the forming the optical member comprising:
      forming a first sub-insulating layer including a plurality of first openings defined therein, on the light emitting surface of the light guide plate;
      forming a plurality of first insulating patterns in the first openings, respectively;
      forming a second sub-insulating layer on the first sub-insulating layer and on the first insulating patterns to dispose each of the first sub-insulating layer and the first insulating patterns between the light guide plate and the second sub-insulating layer;
      forming a third sub-insulating layer including a plurality of second openings defined therein, on the second sub-insulating layer, to dispose the second sub-insulating layer between the third sub-insulating layer and each of the first sub-insulating layer and the first insulating patterns;
      forming a plurality of second insulating patterns in the second openings, respectively; and
      forming a fourth sub-insulating layer on the third sub-insulating layer and on the second insulating patterns to dispose each of the third sub-insulating layer and the second insulating patterns between the second sub-insulating layer and the fourth sub-insulating layer, and
   disposing a light source to face a light incident side surface of the light guide plate,
   wherein
   pairs of insulating patterns within the optical member each include one first insulating pattern and one second insulating pattern, and
   in a top plan view, for each pair of insulating patterns within the optical member, the first insulating pattern is closer to the light incident side surface of the light guide plate than the second insulating pattern.

16. The method of claim 15, wherein
   each of the first and second insulating patterns have a refractive index higher than that of the light guide plate,
   each of the first and second insulating layers have a refractive index lower than or equal to that of the light guide plate,
   the refractive indices of first and second insulating patterns are the same as each other, and
   the refractive indices of first and second insulating layers are the same as each other.

17. The method of claim 15, wherein
   each of the first and second insulating patterns comprises:
      a lower surface and an upper surface which is further from the upper surface of the light guide plate than the lower surface, each of the lower and upper surfaces having a circular shape; and a side surface which connects the lower surface and the upper surface to each other, in a direction parallel to the light emitting surface of the light guide plate, a width of the lower surface is smaller than that of the upper surface, and in cross-section, the side surface is inclined at an angle relative to the light emitting surface of the light guide plate.

18. The method of claim 17, wherein in the top plan view, for each pair of insulating patterns within the optical member, the second insulating pattern overlaps with the first insulating pattern, and the angle of the side surface relative to the light emitting surface of the light guide plate ranges from about 65° to about 75°.

19. The method of claim 17, wherein in the top plan view, for each pair of insulating patterns within the optical member, the second insulating pattern does not overlap the first insulating pattern, and the angle of the side surface relative to the light emitting surface of the light guide plate ranges from about 60° to about 65°.

20. A display device, comprising:

a display panel which displays an image using light; and a backlight unit which generates and provides the light to the display panel, the backlight unit comprising:

a light source which generates the light;

a light guide plate which guides the light from the light source and emits guided light through an upper surface of the light guide plate which faces the display panel; and an optical member disposed on the upper surface of the light guide plate to be between the light guide plate and the display panel and to refract the guided light from the upper surface of the light guide plate toward the display panel, the optical member comprising a plurality of first insulating patterns into which the guided light from the upper surface of the light guide plate is incident and which is disposed on the light guide plate;

a first insulating layer which covers the first insulating patterns;

a plurality of second insulating patterns into which the guided light from the first insulating layer is incident and which is disposed on the first insulating layer; and a second insulating layer which covers the second insulating patterns, wherein the light guide plate includes a light incident side surface at which the light source is disposed and through which the light from the light source is incident to the light guide plate, pairs of insulating patterns within the optical member each include one first insulating pattern and one second insulating pattern, and in a top plan view, for each pair of insulating patterns within the optical member, the first insulating pattern is closer to the light incident side surface of the light guide plate than the second insulating pattern.

* * * * *